US006622111B1

(12) United States Patent
Conboy et al.

(10) Patent No.: US 6,622,111 B1
(45) Date of Patent: Sep. 16, 2003

(54) WAFER ROTATION IN SEMICONDUCTOR PROCESSING

(75) Inventors: Michael R. Conboy, Austin, TX (US); Elfido Coss, Jr., Austin, TX (US); Sam H. Allen, Jr., New Braunfels, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/521,046

(22) Filed: Mar. 8, 2000

(51) Int. Cl.[7] ............... G01C 19/18; G01R 31/265; H01L 21/66
(52) U.S. Cl. ............... 702/150; 438/14; 702/84; 355/53; 355/72
(58) Field of Search ............... 702/84, 105, 150, 702/155, 118; 382/151; 700/60, 121; 438/14; 250/492.21; 716/19, 25; 355/53, 72

(56) References Cited

U.S. PATENT DOCUMENTS

| 2,653,304 | A | | 9/1953 | Wadsworth | 439/738 |
| 5,511,005 | A | * | 4/1996 | Abbe et al. | 702/84 |
| 6,180,424 | B1 | * | 1/2001 | Tigellar et al. | 438/14 |
| 6,331,885 | B1 | * | 12/2001 | Nishi | 355/53 |
| 6,359,678 | B1 | * | 3/2002 | Ota | 355/53 |

FOREIGN PATENT DOCUMENTS

| EP | 0 930 635 A2 | 7/1999 |
| GB | 1032163 | 9/1966 |
| WO | WO 96/20493 | 7/1996 |

* cited by examiner

Primary Examiner—John Barlow
Assistant Examiner—John Le

(57) ABSTRACT

The movement of individual wafers in a semiconductor facility is tracked via a set of coordinates that include rotational points of reference on the wafer that coincide with the wafer's location in the processing line. In an example embodiment, the method includes imparting angles of rotation on the wafers in different stages of the processing system. The different angles of rotation on each wafer are collected as data along with the wafer location in the processing system and the tool/equipment identification code. The combined angle of rotation and wafer location data is used to map the path the wafer has traveled from the onset of processing. An important advantage of the invention is the increased control and traceability that the invention brings to wafer processing.

22 Claims, 4 Drawing Sheets

WAFER ROTATION IN SEMICONDUCTOR PROCESSING

FIELD OF THE INVENTION

The present invention generally relates to processing of material in a manufacturing plant and, more particularly, to methods and systems for tracking the movement of wafers in a semiconductor processing plant.

BACKGROUND OF THE INVENTION

Conventional manufacturing plants move material to be processed through a manufacturing process having several processing areas. Currently these material lots are tracked in larger quantities that may be disposed in a carrier for ease of movement throughout the facility.

Some manufacturing processes require that the item being processed be rotated regularly in order to ensure that the item is properly processed, such as when painting an object or when applying a coating to a substrate. In the case of a mechanical process, the object is rotated to ensure that the tooling is being worn evenly or that the tooling is mechanically treating the object evenly. Even though some of these items may be individually processed, or processed in small lots, the items may form part of a larger lot being manufactured and it is difficult to distinguish the progress of the individual item as it moves through the processing line. As the number of processing steps increase tracking becomes even more difficult. This is particularly a problem in the processing of wafers in a semiconductor processing plant.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes in-groups of about 25 wafers. The wafers are then disposed within a carrier and move from one process step to another in the carrier. The carriers are usually tracked by their carrier code by a computer system as they move through the plant.

Once a lot has been retrieved, and the equipment has been set up, the operation on the wafers by a particular piece of equipment, or "tool," can begin. At this point, the lot is "moved-in" to the operation. An operator on the line then communicates this information to the host computer. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation; therefore the host application and computer have to be notified of these moves. The operator then places the cassette of "moved-out" wafers in the material stocker to await orders as to the location of the next piece of equipment that will perform operations on the wafers.

The semiconductor fabrication plant, including the bays, material stockers and the interconnecting path, typically operates under control of a distributed computer system running a factory management program. In this environment, the automated material handling system (AMHS) may conceptually include the cassettes, the transportation system (e.g., paths) and control system (e.g., the distributed computer system). An empty carriers management system as well as a separate test wafer management system may also form part of the AMHS.

Data gathered during the course of wafer processing is used to diagnose yield problems and forms the basis of yield improvement efforts. Such data includes parametric electrical test data gathered on individual circuits and test structures fabricated on the wafers, as well as wafer sort data which tests the suitability for use of the wafers once wafer processing is completed. One of the possible sources of yield variation is the order in which wafers in a lot are processed at a given processing step. When the processing is done one wafer at a time per step, yield variation may occur due to a build up of contaminants, uneven heating of a processing chamber or another physical aspect that changes during the processing of the lot. In a batch operation, the physical location of the wafer in the batch processing equipment may influence uniformity of the processing effects across the lot. In an example where wafers are moving through a contaminated chamber, if the order in which each wafer is processed is known then the final wafer yield may be plotted against the processing order in this step. For each wafer in a lot a drop-off in yield versus processing order would be observed due to the contamination problem. This data is used to make adjustments to the line to improve yield; however, this wafer tracking method lacks the level of precision in the data collected required by chip plants today.

In tracking the wafer processing order, specialized equipment has been used to read scribed wafer identifiers, either immediately prior to or after critical processing steps, and to store this data for later correlation with device performance. Randomizing the order of the wafers prior to such steps is often done to ensure effects are not compounded. The wafer positional data is fed into a computer system, the device performance metrics for a wafer lot of interest are manually entered, and then all possible graphs of the device metrics for that lot versus wafer processing order at each step are generated. The data is then reviewed to determine those steps at which the processing order may affect performance. This type of approach to tracking wafers can be costly in its implementation due to the amount of hardware and software needed to randomize the wafer order and interface with the wafer processing system's main computer database.

SUMMARY OF THE INVENTION

The present invention is directed to addressing the above and other needs in connection with improving wear rates of tooling and equipment in a semiconductor processing line and improving traceability of product as it moves through the manufacturing process.

According to one aspect of the invention, it has been discovered that by rotating a wafer to a defined angle of rotation and recording the rotation angle and the wafer's corresponding location in the processing line improved accuracy in wafer tracking is achieved. It has also been discovered that tooling wear may be more controlled if the wafer being processed is moved axially prior to processing. Accordingly, a method of rotating a wafer in a multiple stage wafer processing system includes determining an incoming angle of rotation of the wafer as the wafer is presented to a first processing stage of wafer processing. As the wafer is exiting the first processing stage and moving into a second processing stage, the wafer is rotated to an outgoing angle of rotation. The angle of rotation and wafer location is recorded as a set of coordinates for each wafer as the wafer moves through each stage of wafer processing. In a related embodiment, a translation angle of rotation can also be imparted on the wafer while the wafer is within a stage of wafer processing.

According to another aspect of the invention, a system for rotating wafers in a multiple stage wafer processing system includes a scanning arrangement for determining an incoming rotation angle on a wafer as the wafer is presented to a first processing stage. A rotating apparatus rotates the wafer to an outgoing angle of rotation as the wafer is exiting the first processing stage and moving into a second processing stage. A computer arrangement records and tracks the angle of rotation and the corresponding wafer location as a set of coordinates for each wafer as the wafer moves through each stage of wafer processing.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
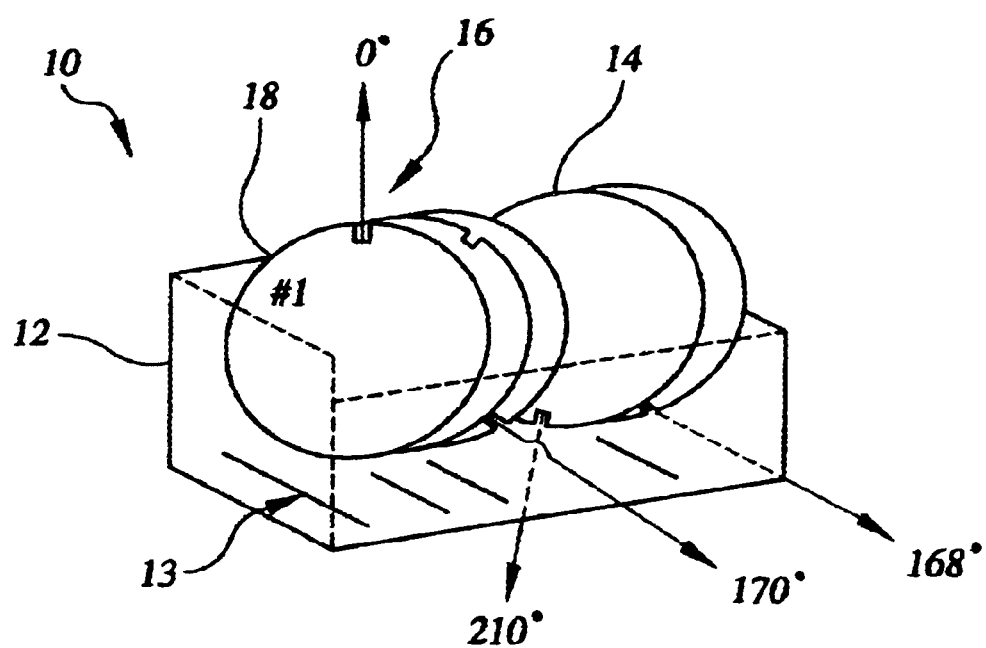
FIG. 1 is a carrier having a set of wafers arranged in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and system for rotating an object in a manufacturing plant. The invention is particularly suited for rotating wafers and recording their movement as they progress through a wafer processing system. While the present invention is not necessarily limited to a wafer processing application the invention will be better appreciated using a discussion of exemplary embodiments in such a specific context.

In an example embodiment, a method of rotating wafers in a multiple stage wafer processing system includes imparting angles of rotation on wafers in different stages as the wafer moves through the processing line. The angles of rotation on each wafer are collected as data along with the corresponding wafer location in the process and the tool/equipment identification code. The data combination will serve as a set of coordinates or markers that can be used to track the movement of the wafer from the onset of processing. In one application, the data is used to develop wafer movement maps that detail the historical movement of each wafer that serve as analysis tools.

Referring now to the figures, FIG. 1 illustrates an example embodiment of a wafer lot 10 arranged in a carrier 12 in accordance with one embodiment of the invention. Carrier 12 has a series of slots 13 that hold individual wafers 14 therein for movement through a wafer processing system. Wafers 14 have a slot or notch 16 located along the circumference that serves as a point of reference. In this example, slot 16 is at 0° degrees and serves as the starting point from which the wafer is rotated axially. The wafers are rotated to different angles of rotation at the onset of processing. In related embodiment, the wafers are rotated randomly, as long as each wafer has a distinct angle of rotation before moving through the process. In another related embodiment, where individual wafer data is not desired and only wafer lot data is of interest, the wafers have the same initial angle of rotation at the onset of wafer processing. In one example, each wafer can be given about 360 angles of rotation, of 1 degree each, excluding the slot portion of the wafer and the scribe portion.

In other manufacturing applications, it is important to identify the axis of rotation of the object and the starting or reference point from which the angle of rotation will be measured. For example, where the object is a thin film display panel, the axis of rotation is similar to that of a wafer in that the panel is flat and acts as a substrate while its being processed. In one instance, the panel has about 4 main angles of rotation due to the panel's square shape.

Where the wafers are to be subjected to common process steps, such as heating in a furnace, the wafers are usually arranged in tubes. Since many tubes include up to 100 wafers, in this example each set of wafers is to have a distinct angle of rotation with respect to the adjacent wafer set. In a related example, each wafer has a distinct angle of rotation with respect to all of the wafers in the tube. Referring briefly to FIG. 1, each wafer also has a scribe or a code 18 located on the wafer for identifying the wafer. In addition, each carrier and cassette in the wafer processing system is also identified and tracked by an identification tag, such as a bar code, which is read by a sensor along the processing path.

Figure 2:
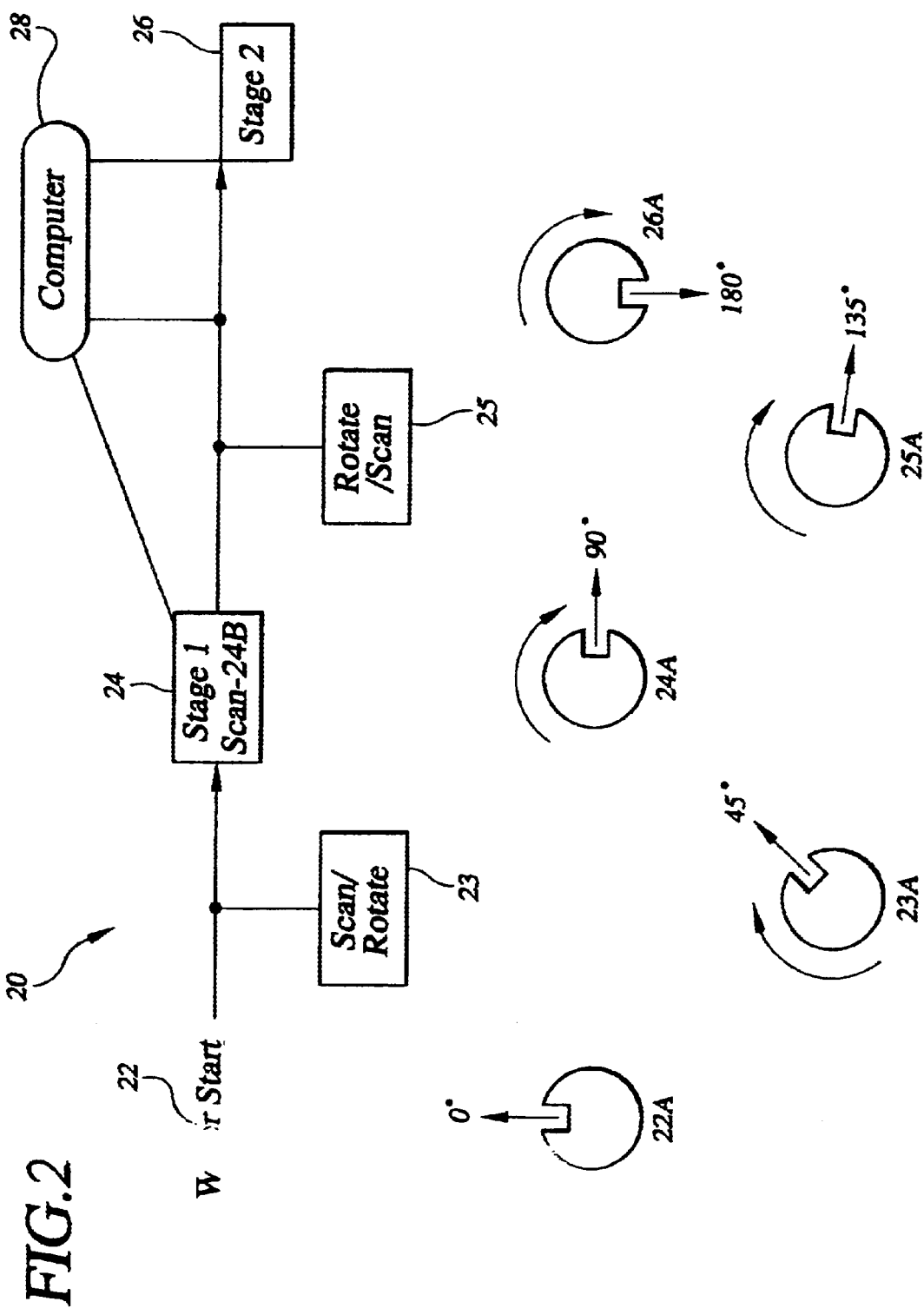
FIG. 2 is a process flow diagram of an example wafer process line and the angles that the wafer is rotated to as the wafer moves through the process in accordance with one embodiment of the invention.

Referring now to FIG. 2, a process flow diagram exemplifies a wafer processing line 20 that has a computer arrangement coupled thereto. FIG. 2 also illustrates a wafer having different angles of rotation as it moves through the wafer process. The different angles of rotation correspond to the various steps of the process. At location 22, the wafer lot is started and wafer 22A has an initial angle of rotation of 0 degrees. The wafer is also identified at this point by its code and slot position in the carrier and this information is recorded in a computer arrangement 28. The movement of the wafer is tracked with this information and the successive angles of rotation are used to create a historical map of the movement of the wafer through the process.

In another embodiment, it is advantageous to impart an initial angle of rotation at 22A, either randomly or a predetermined angle. At location 23, the wafer is rotated to an angle of 45 degrees, now 23A, and scanned for identification. In this example, the rotation of the wafer is done with a wafer sorter that scans and sorts the wafers. The sorter identifies the wafer and the slot location and usually includes a robotic arm that imparts an angle of rotation on the wafer. The data that is generated after the scanning of the wafers is then recorded in the database of computer 28, with the computer being coupled to wafer processing line 20. Wafer 23A has an incoming angle of 45 degrees as it proceeds into the first stage of processing at location 24. A translation angle is added to the wafer due to the pick and place action (possibly by a robotic arm) that occurs as the wafer is removed from the carrier and placed into the first stage at location 24, resulting in wafer 24A. After the translation angle is added the wafer has an angle of rotation of 90 degrees. The wafer is scanned at 24B and the rotation angle is recorded in the computer database. Wafer 24A exits the first stage at location 24 and is again rotated another 45 degrees at location 25 to result in wafer 25A with an angle of rotation of 135 degrees. The new angle is scanned and recorded at computer 28 as the outgoing angle of the process. When the wafer moves into a second stage of processing at location 26 another translation angle is added to the wafer resulting in wafer 26A at 180 degrees.

Figure 3:
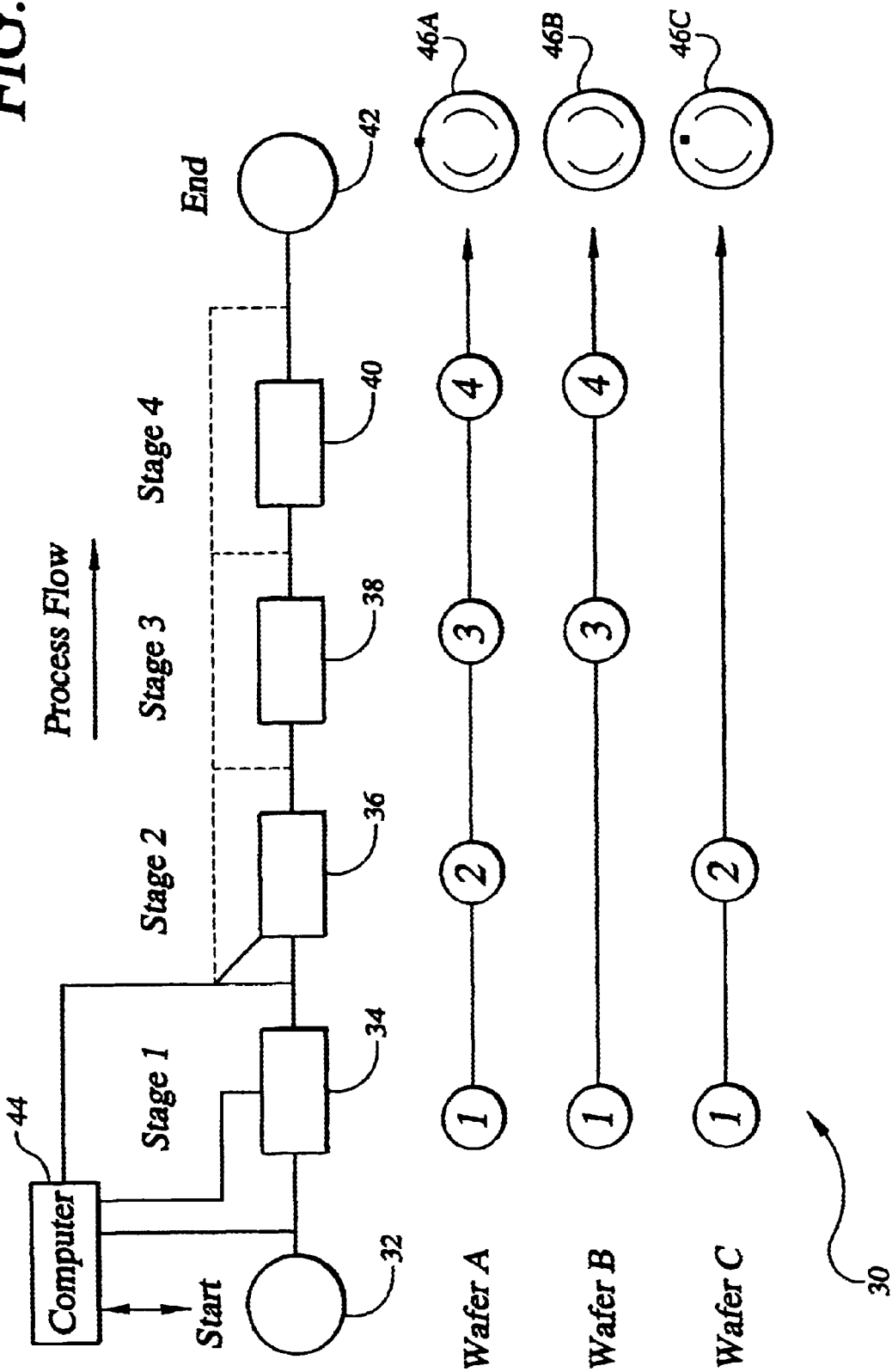
FIG. 3 is a process flow diagram of an example wafer process line and the three wafers that move through different stages of the process line in accordance with one embodiment of the invention.

Referring to FIG. 3, a process flow diagram of an example wafer processing line 30 is illustrated with three wafers (A-C) moving through the processing line. Wafer processing starts at 32 and proceeds through four processing locations 34, 36, 38 and 40 before coming to an end at 42. A computer 44 is coupled to the processing line at about every point in the processing line in order to collect data on the movement of wafers in the system. Wafer A moves through the processing line, as indicated by the numbers under the locations, and wafer A is moved through each stage of the processing line. In this example, angles of rotation are imparted upon every movement of wafer A through the processing line. The angle of rotation data is tied to the corresponding processing stage and tool and then this information is recorded in the computer.

FIG. 3 is also representative of processing three sets of wafers through a processing line. Although each set of wafers may be required to be processed according to its own processing recipe, the group of wafers may have a common processing step, such as going through the furnace in a tube holding about 100 wafers. In one example, the wafers are arranged such that each set of wafers has a different angle of rotation with respect to the adjacent set of wafers. In another example, each wafer in the tube has a different angle of rotation that is distinct from any other wafer. The processing line includes a scanning device for verifying that the angle of rotation of the wafers are distinct from each other before proceeding through the line.

Wafer sets B and C also move through the processing line but follow different routes due to the lot sizes and the types of processing recipes applied to the wafers. Wafer set B is processed through stages at locations 34, 38 and 40. The angle of rotation data for wafer set B differs from that of wafer set C in that more angles of rotation are imparted due to the fact that more processing steps are involved. As a whole, the set of angles for wafer set B versus wafer set C is also different due to the different path taken during processing. In both cases, the angles of rotation are tied to a corresponding processing stage and tool; this data is then recorded in computer 44 in order to create the historical movement map of each wafer or wafer lot.

In a related embodiment, in the second stage of processing location 36 represents a multiple chamber subsystem having a number of tools associated therewith and subprocesses that a wafer moves through. Additional angles of rotation are imparted in this subsystem that are then recorded as part of the mapping process. In a related embodiment, one of the chambers includes a rotating table device that is used to create a balanced subprocess, such as wafer coating. The current invention integrates the rate of rotation of the table into the calculations of the angles of rotation and records this data as well in the movement map of the wafer.

Figure 4:
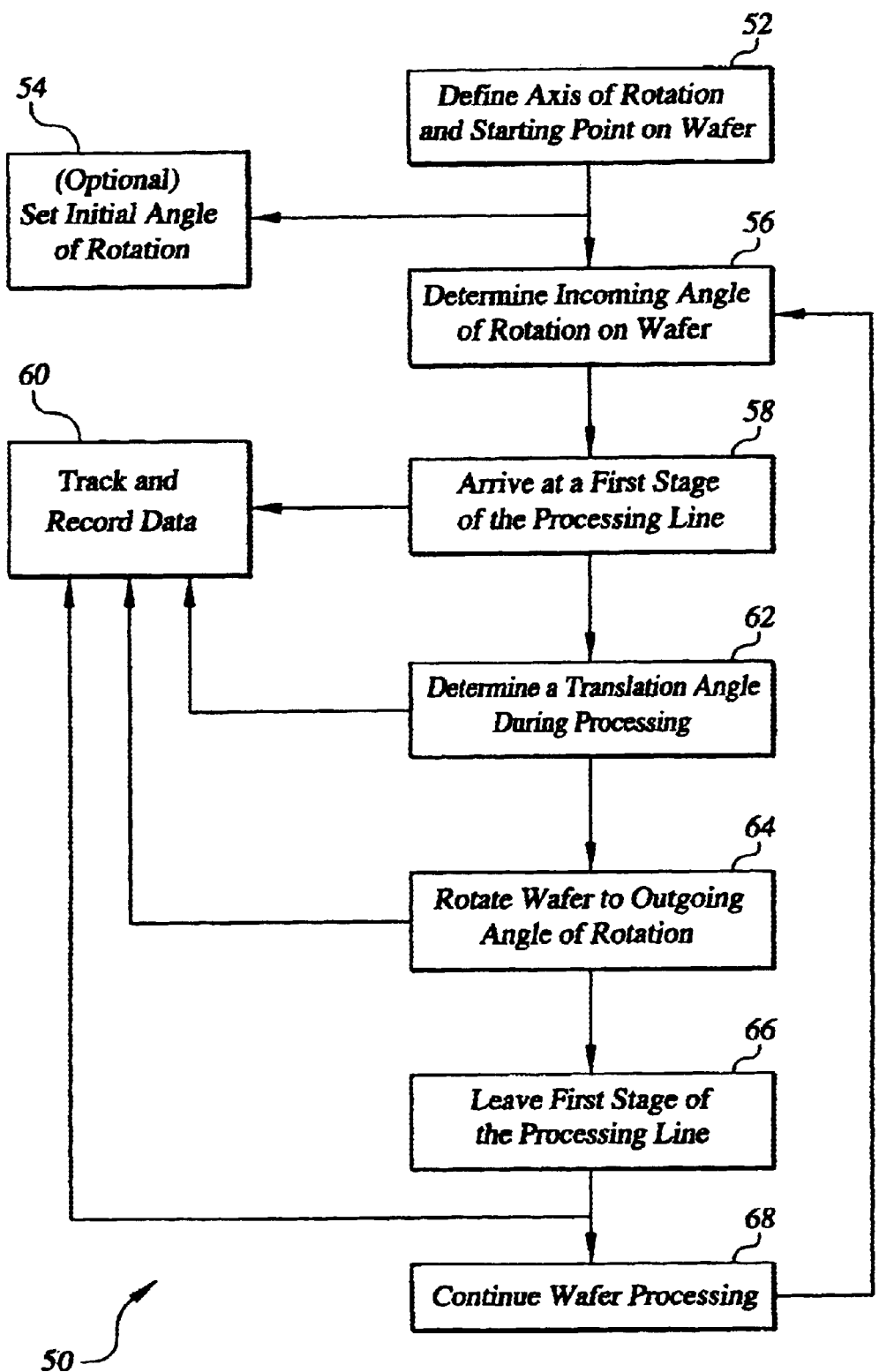
FIG. 4 is a flowchart of the manner in which objects are rotated and tracked in a manufacturing line in accordance with one embodiment of the invention.

Referring to FIG. 4, flowchart 50 illustrates an example of the flow of the method of rotating a wafer in accordance with an embodiment of the present invention. At 52, the axis of rotation of the wafer is defined as well as the starting point on the wafer for measuring the subsequent angles of rotation. At 54, an optional step in processing includes imparting an initial angle of rotation on the wafer and recording the data in the database of computer arrangement 60. At 56, an incoming angle of rotation is defined for the wafer and this data is recorded at 60. The wafer now arrives at a first processing stage at 58. As the wafer is moved into the first processing stage, the action of picking up the wafer and placing it in the processing stage imparts a translation angle. The translation angle is then defined at 62 and recorded at 60. Once the processing at the first stage is complete, a mechanical arm or rotating table rotates the wafer to give it an outgoing angle of rotation at 64. The wafer then exits the first stage at 66 and continues to the second stage; the wafer location and rotation angle being recorded at 60. The flow repeats itself at 56 as the wafer is identified and the incoming angle of rotation of the wafer is determined and recorded. The flow is equally applicable to other items such as flat panel displays. An additional step in the flow can include an angle verification step to ensure that the wafers are at the angle of rotation that was originally intended.

In some parts of the processing system, it is advantageous to stop rotating the wafers, such as in the photolithography area, due to alignment issues. However, upon completion the wafers can be returned to the angle of rotation that they had prior to arriving to the photolithography area and then moved on to the next processing stage. In a related embodiment, a control system is included that captures wafer-processing data from prior production runs. The control system data is then shared with the computer arrangement of the rotation system and used to make adjustments up and down the line to improve processing of wafers. For instance, the angles of rotation that are being imparted on the wafers can change due to some change in conditions on the line. The change can be externally or internally driven, but now is manageable with a feedback control loop that is integrated into the processing system.

As noted above, the present invention is applicable to a number of techniques for rotating and tracking material that is being processed in a manufacturing plant. Accordingly, the present invention is not necessarily being limited to the particular examples described above, but is intended to cover all aspects of the invention as fairly set out in the attached claims. For instance, while the rotation and tracking of wafers in a semiconductor facility are illustrated, other positional adjustments may be made to various objects during processing. These adjustments can lead to improvements in the product, in the manufacturing process or in the yield of product. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of rotating wafers in a multiple stage wafer processing system, the method comprising:

determining an incoming angle of rotation of the wafer as the wafer is presented at a first processing stage;

rotating the wafer to an outgoing angle of rotation as the wafer is exiting the first processing stage and moving into a second processing stage; and recording as data the rotation angle and a corresponding wafer location in the processing system as the wafer moves through each stage of wafer processing.

2. The method of claim 1, further including the step of determining and recording a translation angle of rotation and the corresponding wafer location while the wafer is within the first processing stage.

3. The method of claim 1, further including the step of recording an identification code disposed on the wafer and recording the position of the wafer in a carrier slot.

4. The method of claim 1, wherein the step of recording data includes recording the data in connection with a particular stage and tool in the processing system.

5. The method of claim 1, wherein the step of recording data further includes recording angle of rotation wafer data in connection with the wafer moving through a multiple chamber location in the processing system.

6. The method of claim 1, wherein the step of rotating the wafer includes rotating the wafer to the exclusion of a certain processing stage in the system.

7. The method of claim 1, wherein the step of rotating the wafer includes rotating the wafer to the exclusion of certain areas on the wafer.

8. The method of claim 1, wherein the step of rotating the wafer includes randomly rotating the wafer axially and recording the wafer position data by carrier slot and by angle.

9. The method of claim 1, wherein the step of recording rotation angles includes using a computer arrangement to develop a historical wafer movement map composed of a plurality of sets of coordinates, each set of coordinates including the angle of rotation and the corresponding location of the wafer in the processing system.

10. The method of claim 1, wherein the wafer includes a flat panel display substrate.

11. A method of rotating wafers in a multiple stage wafer processing system, the method comprising:

determining an incoming angle of rotation of the wafer as the wafer is presented at a first processing stage;

rotating the wafer to an initial angle of rotation prior to determining the incoming angle of rotation, the initial angle of rotation measured from a predetermined starting point on the wafer;

rotating the wafer to an outgoing angle of rotation as the wafer is exiting the first processing stage and moving into a second processing stage; and recording as data the rotation angle and a corresponding wafer location in the processing system as the wafer moves through each stage of wafer processing.

12. The method of claim 11, wherein the step of rotating the wafer to the initial angle of rotation includes placing more than one set of wafers in a single carrier and arranging each set of wafers with a distinct rotation angle with respect to the adjacent set of wafers within the carrier.

13. The method of claim 12, further including the step of arranging all of the wafers in the carrier such that each of the wafers has the distinct angle of rotation from any other wafer in the carrier.

14. The method of claimed 13, further including the step of verifying that all of the wafers have the distinct angle of rotation.

15. A system for rotating wafers in a multiple stage wafer processing system, the system comprising:

means for determining an incoming angle of rotation of the wafer as the wafer is presented to a first processing stage of wafer processing;

means for rotating the wafer to an outgoing angle of rotation as the wafer is exiting the first and moving into a second stage of wafer processing; and a computer arrangement for recording as data the wafer rotation angles and a corresponding wafer location in the processing system as the wafer moves through each stage of wafer processing.

16. The system of claim 15, wherein the computer arrangement is adapted to develop a historical wafer movement map composed of a plurality of sets of coordinates, each set of coordinates including the angle of rotation and the corresponding location of the wafer in the processing system.

17. The system of claim 15, wherein rotation angle determining means includes a scanning arrangement adapted to determine a translation angle of rotation on the wafer while the wafer is within a stage of processing.

18. The system of claim 15, further including a wafer carrier movement detector for determining the rate of rotation of a carrier moving through the processing system, such data being recorded into the computer arrangement.

19. The system of claim 15, further including a multiple chamber subsystem that imparts additional angles of rotation on the wafer that are recorded in the computer arrangement.

20. A method of rotating an wafer in a multiple stage wafer processing system, the method comprising:

determining an incoming angle of rotation of the wafer as the wafer is moving into a first stage of processing;

determining an angle of translation of the wafer as the wafer is in the first stage of processing;

rotating the wafer to an outgoing angle of rotation as the wafer is exiting the first stage of processing and moving into a second stage of processing; and tracking and recording as data the rotation angles and the corresponding wafer location in the processing system as the wafer moves through each stage of wafer processing.

21. A method of rotating wafers in a multiple stage wafer processing system, the method comprising:

determining an incoming angle of rotation of the wafer as the wafer is presented at a first processing stage;

rotating the wafer to an initial angle of rotation prior to determining the incoming angle of rotation, the initial angle of rotation measured from a predetermined starting point on the wafer; and rotating the wafer to an outgoing angle of rotation.

22. The method of claim 21, further including the step of recording as data the rotation angle and a corresponding wafer location in the processing system as the wafer moves through each stage of wafer processing.

* * * * *